United States Patent
Park

(10) Patent No.: US 7,192,163 B2
(45) Date of Patent: Mar. 20, 2007

(54) LIGHT-EMITTING UNIT WITH ENHANCED THERMAL DISSIPATION AND METHOD FOR FABRICATING THE SAME

(75) Inventor: Hee Jeong Park, Seoul (KR)

(73) Assignee: LG.Philips LCD Co. Ltd., Seoul (KR)

( * ) Notice: Subject to any disclaimer, the term of this patent is extended or adjusted under 35 U.S.C. 154(b) by 0 days.

(21) Appl. No.: 11/274,332

(22) Filed: Nov. 16, 2005

(65) Prior Publication Data

US 2006/0139932 A1    Jun. 29, 2006

(30) Foreign Application Priority Data

Dec. 27, 2004  (KR)  .................... 10-2004-0112693

(51) Int. Cl.
- H01I 29/22 (2006.01)
- F21V 29/00 (2006.01)
- F21V 21/00 (2006.01)
- B60Q 1/06 (2006.01)

(52) U.S. Cl. .................. 362/294; 362/373; 362/249; 257/99

(58) Field of Classification Search ............... 362/294, 362/373, 249, 609, 632; 257/99
See application file for complete search history.

(56) References Cited

U.S. PATENT DOCUMENTS

| | | | |
|---|---|---|---|
| 6,517,218 B2* | 2/2003 | Hochstein | 362/294 |
| 6,958,789 B2* | 10/2005 | Cueff et al. | 349/61 |
| 6,999,318 B2* | 2/2006 | Newby | 361/719 |
| 2001/0030866 A1* | 10/2001 | Hochstein | 362/294 |
| 2003/0189830 A1* | 10/2003 | Sugimoto et al. | 362/294 |
| 2005/0045901 A1* | 3/2005 | Wall, Jr. | 257/99 |

* cited by examiner

Primary Examiner—Renee Luebke
Assistant Examiner—Evan Dzierzynski
(74) Attorney, Agent, or Firm—Seyfarth Shaw LLP

(57) ABSTRACT

A light-emitting unit includes a housing, a heat sink member having surfaces outside of the housing, a light-emitting diode attached to the heat sink member, and a molding member formed on the housing.

19 Claims, 4 Drawing Sheets

LIGHT-EMITTING UNIT WITH ENHANCED THERMAL DISSIPATION AND METHOD FOR FABRICATING THE SAME

The present invention claims the benefit of Korean Patent Application No. 112693/2004 filed in Korea on Dec. 27, 2004, which is hereby incorporated by reference in its entirety.

BACKGROUND OF THE INVENTION

1. Field of the Invention

The present invention relates to a light-emitting device, and more particularly, to a light-emitting unit with enhanced thermal dissipation and method for fabricating the same. Although the present invention is suitable for a wide scope of applications, it is particularly suitable for dissipating heat from a light-emitting unit that uses a light emitting diode as a light source.

2. Discussion of the Related Art

In general, a light-emitting device can be used as a high-brightness light source for flashlights, a backlight source for portable electronic devices, a light source for electronic display boards, an illumination light source for switches, a beaconlight, a traffic signal light, and so on. For example, a light-emitting device can be a plurality of light-emitting units in a light-emitting package. Such a package can be used as a backlight in portable phones, camcorders, digital cameras, and PDAs.

FIG. 1 is a perspective view of a related art light-emitting package. FIG. 2 is a cross-sectional view taken along line A–A' in FIG. 1. Referring to FIGS. 1 and 2, a light-emitting package 60 includes a printed circuit board (PCB) 3, and a plurality of light-emitting units 1 installed on the PCB 3. Each of the light-emitting units 1 includes a housing 7, a light emitting diode (LED) 5, a heat sink member 9 attached inside the housing 7 and attached to the LED 5 for dissipating heat generated by the LED 5, a molding member 11 formed on the housing 7 to cover the LED 5, and first and second leads 13 and 15 for supplying electric power to the LED 5.

More specifically, the first leads 13 are electrically connected to a first metal electrode 25a and the second leads 15 are commonly connected to a second metal electrode 25b of the LED 5. These connections can be implemented by wire bonding. Although not shown in FIGS. 1 and 2, the LED 5 is attached to the heat sink member 9 with an electrically insulating adhesive.

As shown in FIG. 2, the PCB 3 includes a heat sink plate 21, an insulating layer 23 formed on the heat sink plate 21, and a patterned metal electrode layer formed on the insulating layer 23. The metal electrode layer includes first and second metal electrodes 25a and 25b formed on both side surfaces of the PCB 3, and a third metal electrode 25C formed on a center surface of the PCB 3. The PCB 3 has a rectangular shape extending in a lengthwise direction. The first to third electrodes 25a to 25c also extend in the lengthwise direction. Insulating members 27 for preventing an electrical short are positioned between the first metal electrode 25a and the third metal electrode 25c as well as between the second metal electrode 25b and the third metal electrode 25c.

The light emitting units 1 is are attached to the third electrode 25c with a thermal conductive adhesive 17. The first and second leads 13 and 15 of the light-emitting units 1 are commonly attached respectively to the first and second metal electrodes 25a and 25b with a silver paste 19. In the related art light-emitting package 60, electric power supplied to the first and second metal electrodes 25a and 25b is commonly applied to the light-emitting units 1 through the first and second leads 13 and 15. This applied electric power causes all of the light-emitting units 1 to emit light.

An LED does not have perfect light-emission efficiency in converting electrical energy to light energy. Accordingly, some of the supplied electrical power is converted into heat. This heat increases the operating temperature of the LED so as to degrade the operating characteristics of the LED.

The operating temperature of the LED is inversely proportional to the energy bandgap, and the energy bandgap is inversely proportional to the wavelength of light emitted from the LED. Accordingly, as the operating temperature of the LED increases, the energy bandgap becomes narrower, and thus the wavelength of the emitted light increases. Therefore, when an LED emitting blue light has an increase in its operating temperature, it may emit green light, rather than blue light. This phenomenon is called "a color shift". Consequently, when the heat generated by the LED is not rapidly dissipated to the outside, a desired-color light cannot be obtained due to color shift by the LED. Further, the brightness efficiency of light emitted from an LED decreases as the operating temperature of the LED increases.

In the light-emitting package 60, heat generated from the LEDs 5 is transferred by the heat sink members 9 to the heat sink plate 21 such that the heat can then be dissipated to the outside. However, there is a limitation as to how much heat can be rapidly transferred from the light-emitting units 1 to the heat sink plate 21 through the heat sink members. Thus, there is a limited amount of power that can be provided to the LEDs before the operating characteristics of the LEDs degrade. Also, there is a limit to how much the overall thickness of the light-emitting package can be reduced because of the thickness of the heat sink member 9 in the light-emitting unit 1 together with the thickness of the PCB 3.

SUMMARY OF THE INVENTION

Accordingly, the present invention is directed to a light-emitting unit with enhanced thermal dissipation and a method for fabricating the same that substantially obviate at least problems due to limitations and disadvantages of the related art.

An object of the present invention is to provide a light-emitting unit with enhanced thermal dissipation and a method for fabricating the same with improved heat transfer.

Another object of the present invention is to provide light-emitting unit with enhanced thermal dissipation and a method for fabricating the same, which enables a reduced thickness light-emitting package.

A further object of the present invention is to provide a light-emitting unit with enhanced thermal dissipation and a method for fabricating the same for a backlight unit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a light-emitting unit that includes a housing, a heat sink member having surfaces outside of the housing, a light-emitting diode attached to the heat sink member, and a molding member formed on the housing.

In another aspect of the present invention, there is provided a light-emitting package including: a plurality of light-emitting units in which each unit having a housing, a heat sink member having surfaces outside of the housing, and a light emitting diode attached to the heat sink member; a heat sink plate for dissipating heat; recesses respectively corresponding to each of the plurality of light-emitting units; and a printed circuit board having an electrode for supplying electric power to the light emitting diode of each of the plurality of light-emitting units, wherein the heat sink member of each of the plurality of light-emitting units is within a corresponding recess of the heat sink plate.

In a further another aspect of the present invention, there is provided a method for fabricating a light-emitting package that includes forming a plurality of light-emitting units that each include a housing, a heat sink member having surfaces outside of the housing, and a light-emitting diode attached to the heat sink member, forming a heat sink plate having a plurality of recesses corresponding to each of the light-emitting units, and a printed circuit board having an electrode for supplying electric power to the light-emitting units, and positioning each of the heat sink members for the light-emitting units within the corresponding recess in the heat sink plate for the light-emitting unit.

In yet another aspect of the present invention, there is provided a backlight unit including: a frame; a plurality of light-emitting packages disposed on the frame, each of the light-emitting packages having a printed circuit board having a heat sink plate with a plurality of recesses formed therein, a plurality of light-emitting units that each have a heat sink member attached inside the corresponding recess of the heat sink plate, the heat sink member being outside; and a diffusion plate disposed over the light-emitting package to diffuse light emitted from the light-emitting package.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 3:
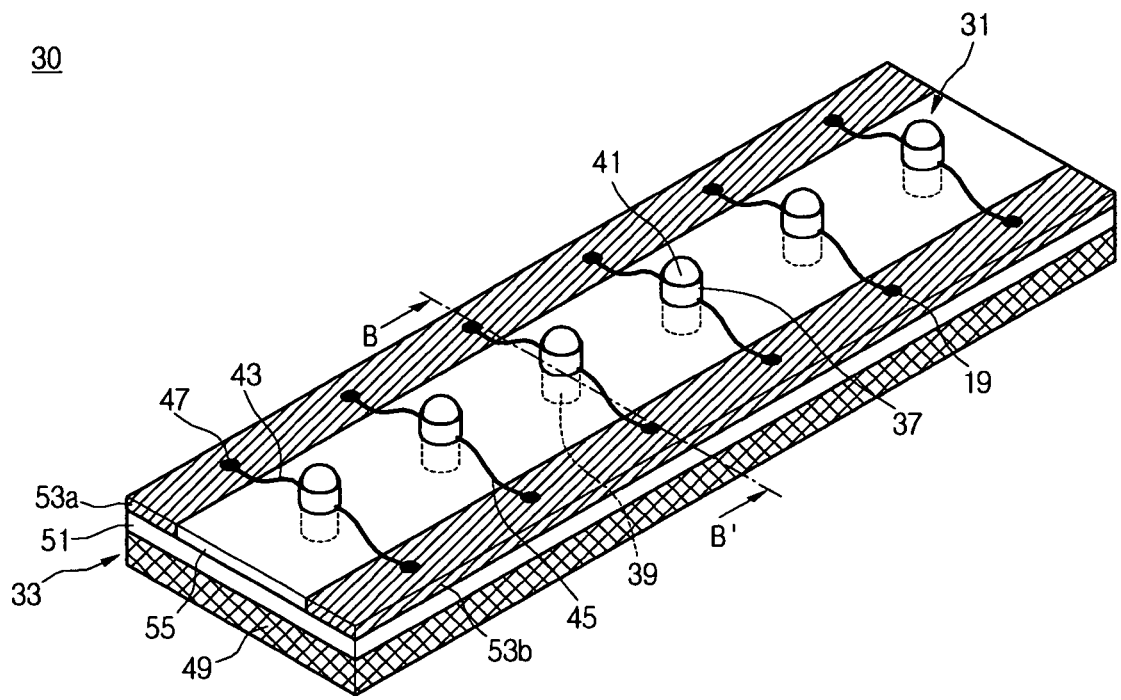
FIG. 3 is a perspective view of a light-emitting package according to an embodiment of the present invention.
Figure 4:
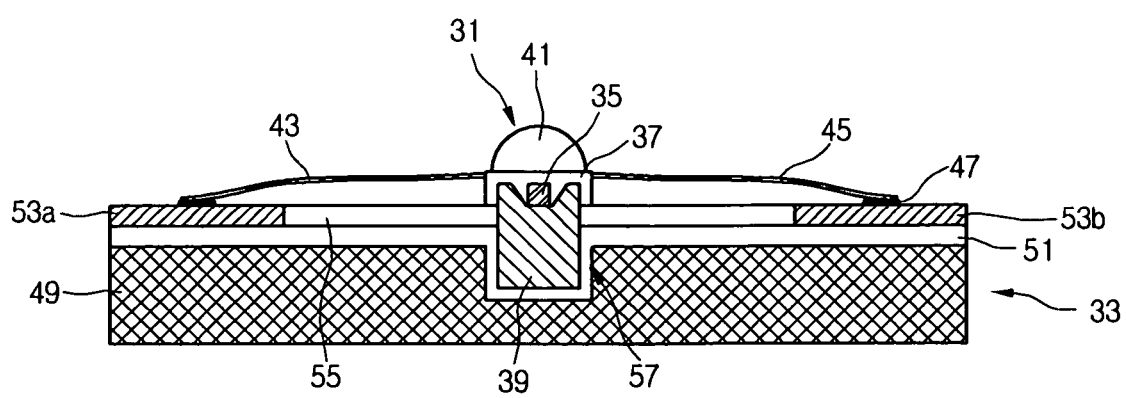
FIG. 4 is a cross-sectional view taken along line B–B' in FIG. 3.
Figure 5:
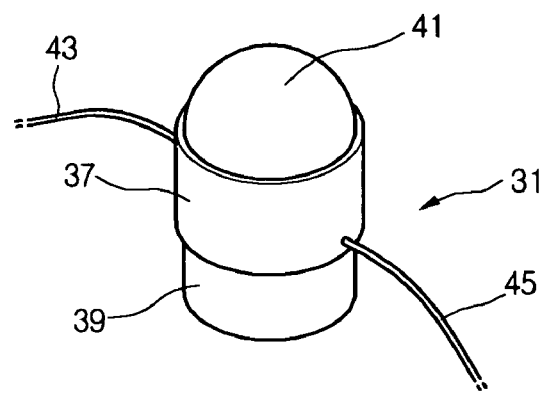
FIG. 5 is a perspective view of a light-emitting unit illustrated in FIG. 3.

FIG. 3 is a perspective view of a light-emitting package according to an embodiment of the present invention, FIG. 4 is a cross-sectional view taken along line B–B' in FIG. 3, and FIG. 5 is a perspective view of a light-emitting unit illustrated in FIG. 3. Referring to FIGS. 3 to 5, a light-emitting package 30 includes a PCB 33, and a plurality of light-emitting units 31 installed on the PCB 33. The PCB 33 can be a metal core printed circuit board (MCPCB) that has a heat sink plate for dissipating heat and an electrode pattern for supplying electric power.

The light-emitting units can be a plurality of R/G/B light-emitting units that are arranged on the PCB 33 and are spaced apart from one another by a predetermined distance. Alternatively, the light-emitting units may be a plurality of white light-emitting units that are arranged on the PCB 33 and are spaced apart from one another by a predetermined distance.

Each of the light-emitting units 31 can include a light emitting diode (LED) 35, a housing 37, and a heat sink member 39 having surfaces outside of the housing 37 for transferring heat generated by the LED 35, a molding member 41 formed on the housing 37 to cover the LED 35, and first and second leads 43 and 45 for supplying electric power to the LED 35. The LED 35 is attached on the heat sink member 39 with an electrically insulating adhesive. The LED 35 is made of a III-V group compound semiconductor material. Although not illustrated in the drawings, the LED 35 is connected to the first and second electrodes. When electric power is applied to the first and second electrodes through the first and second leads 43 and 45, light is emitted from the LED 35. The heat sink member 39 may be formed of a metallic material having thermal conductivity high enough to function as a heat sink member, such as aluminum.

The LED 35 can be connected by wire bonding. Alternatively, the LED may be connected by flip-chip bonding. These bonding methods are well known to those skilled in the art and thus a detailed description thereof will be omitted in the interest of conciseness.

The molding member 41 may be formed of resin-based material, such as ethylene. The molding member 41 is formed to cover the LED 35. In order to obtain a specific-colored light, a phosphor may be formed around the LED 35. For example, when the phosphor is a material for emitting a white light, light emitted from the LED 35 can be converted into a white light by the phosphor. When the phosphor is formed around the LED 35, the molding member 41 may be formed on the phosphor.

The housing 37 adheres the heat sink member 39 and the molding member 41 together. Since the housing 37 serves to merely affix the heat sink member 39 and the molding member 41, it typically has a small thickness between the molding member 41 and the heat sink member 39. That is, the housing 37 may be formed to have a smaller thickness between the molding member 41 and the heat sink member 39 than the heat sink member 39 between the LED 35 and the bottom surface of the heat sink member 39. The light-emitting units 31 may be manufactured individually and then installed on the PCB 33.

The PCB 33 includes a heat sink plate 49, and an insulating layer 51 formed on the heat sink plate 49, and a patterned metal electrode formed on the insulating layer 51. The metal electrode layer can include first and second metal electrodes 53a and 53b formed on both side surfaces of the PCB 33. The first and second metal electrodes 53a and 53b may be formed of a highly conductive material, such as copper. Insulating members 55 between the first and second metal electrodes 52a and 53b prevent shorts between the electrodes. The PCB 33 has a rectangular shape extending in a lengthwise direction. The first and second electrodes 53a and 53b also extend in the lengthwise direction.

Figure 1:
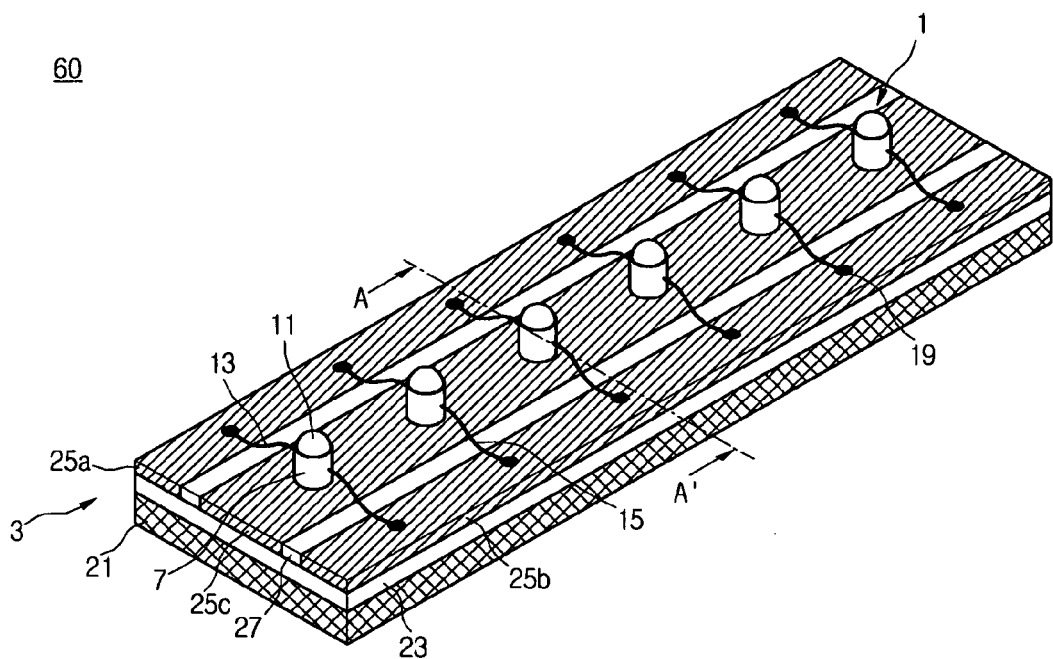
FIG. 1 is a perspective view of a related art light-emitting package.
Figure 2:
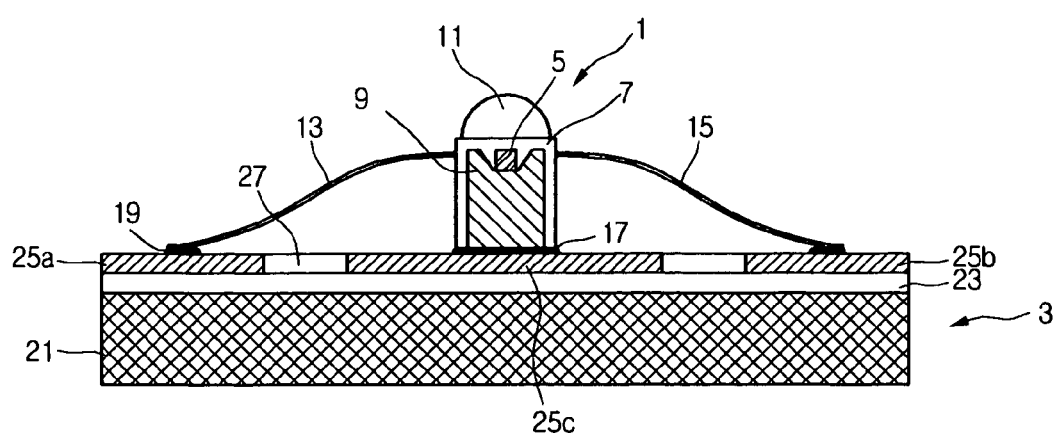
FIG. 2 is a cross-sectional view taken along line A–A' in FIG. 1.

Unlike the light-emitting units 1 of the related art shown in FIGS. 1 and 2, the light-emitting units 31 in embodiments of the present invention have a heat sink member 39 with a bottom surface outside of the housing 37 and a lower portion of a side surface outside of the housing 37. These surfaces of the heat sink member 39 transfer heat through the insulating layer 51 to inner surfaces of a recess 57 in the heat sink plate 49. Accordingly, the heat conduction area between the heat sink member 39 and the heat sink plate 49 is increased, thereby enhancing heat dissipation.

The heat conduction area between the heat sink member 39 and the heat sink plate 49 is increased by inserting the surfaces of the heat sink member 39 of each light-emitting unit 31 into a corresponding recess 57 within the heat sink plate 49. An adhesive (not shown) having electrically insulative and thermally conductive characteristics can be used to attach a light-emitting unit 31 and the PCB 33 together. That is, the adhesive may be formed in the recess 57 on the insulating layer 51 within the recess 57, and then the heat sink member 39 may be attached inside the recess 57.

The bottom and side outer surfaces of the heat sink member 39 contact the bottom and inner surfaces of the recess 57, respectively. Therefore, a heat conduction area between the heat sink member 39 and the heat sink plate 49 is increased, and thus heat generated by the LED 35 attached to the heat sink member 39 can be rapidly transmitted to the heat sink plate 49 via the heat sink member 39. The increased heat conduction area between the heat sink member 39 and the heat sink plate 49 causes an increase in the heat dissipation efficiency so that more power can be applied to the LED 35 for higher brightness and less color shift. Attaching the heat sink members 39 inside of corresponding recesses 57 of the heat sink plate 49 also enables an overall decrease in the thickness of the light-emitting package 30.

As shown in FIG. 3, a plurality of the light-emitting units 31 are installed on the PCB 33. Because a lot of heat may need to be dissipated due to the increased flow of heat through wider conduction area created by the recess, the heat sink plate 49 may be formed of metallic material having high thermal conductivity, such as aluminum. Because the plurality of the light-emitting units 31 in embodiments of the present invention more efficiently transfer heat to the heat sink plate, the heat sink plate 49 may be formed to have a larger occupation area than the heat sink member 39 of the related art to further increase heat sink capacity.

The first and second lead frames 43 and 45 of the light-emitting units 31 are commonly attached respectively to the first and second metal electrodes 53a and 53b with silver paste (not shown). In the so-constructed light-emitting package 30, electric power supplied to the first and second metal electrodes 53a and 53b is commonly applied to the LEDs 35 through the first and second leads 43 and 45. This applied electric power causes the LED 35 to emit light.

As the LEDs 35 emit light, heat is generated by the LEDs 35 and is transmitted to the heat sink plate 49 through the heat sink member 39. The bottom and side outer surfaces of the heat sink member 39 are within the bottom and inner side surfaces of the recess 57. Accordingly, heat generated from the LED 35 attached to the heat sink member 39 can be rapidly transmitted to the heat sink plate 49 through the heat sink member 39, thereby increasing heat sink efficiency. Consequently, color shift is prevented so that a desired-color light can be maintained. Further, degradation of the brightness efficiency due to an increase in operating temperature of the LEDs 35 can be prevented. Moreover, the heat sink member 39 is attached within the PCB 33 and thus the thickness of the LED package can be reduced by the thickness of the heat sink member 39 within the PCB 33.

Figure 6A:
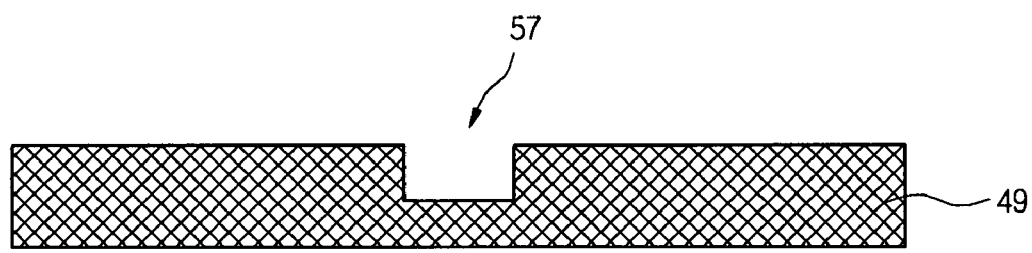
FIGS. 6A to 6D are views illustrating a process for fabricating a light-emitting package according to an embodiment of the present invention.

FIGS. 6A to 6D are views illustrating a process for fabricating a light-emitting package according to an embodiment of the present invention. Referring to FIG. 6A, a heat sink plate 49, which has a rectangular shape extending in a lengthwise direction has a plurality of spaced-apart recesses 57 formed on its upper surface in the lengthwise direction. The heat sink plate 49 may be formed of metallic material having a high thermal conductivity, such as aluminum. The recesses 57 may be formed by a molding, pressing or cutting process. The recesses 57 are formed to have a width greater than the width of the heat sink member 39.

Figure 6B:
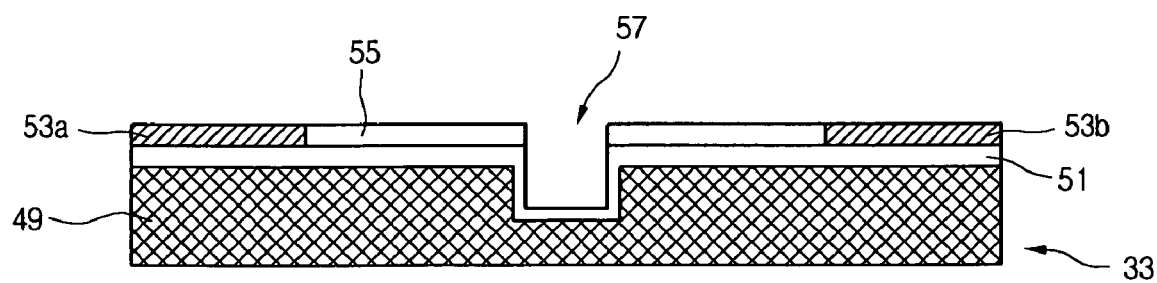

Referring to FIG. 6B, an insulating layer 51 is formed on the heat sink plate 49 in which the recesses 57 have been formed through a coating or deposition process. The insulating layer 51 is formed on the heat sink plate 49 to prevent an electrical short between the heat sink plate 49 and later formed first and second metal electrodes 53a and 53b.

Next, a metallic material having a high conductivity is coated or deposited on the insulating layer 51, and then the coated or deposited metallic material is etched, thereby forming the first and second metal electrodes 53a and 53b. An insulating member 55 for preventing an electrical short between the first or second metal electrodes 52a and 53b is formed by a deposition or coating process.

Figure 6C:
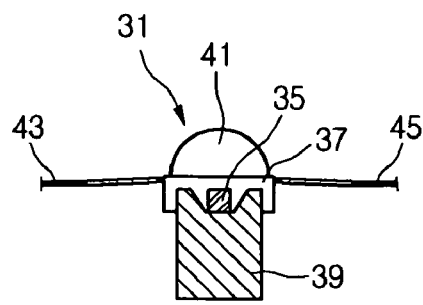

Referring to FIG. 6C, a light-emitting unit 31 having a heat sink member 39 with surfaces is prepared. In the light-emitting unit 31, the heat sink member 39 is affixed to a housing 37, an LED 35 is attached to the heat sink member 39, a molding member 41 is formed on the housing 37 over the LED 35, and first and second leads are electrically connected to the LED 35. For simplicity, only a single light-emitting unit 31 is illustrated in FIG. 6C. However, a plurality of light-emitting units 31 are installed on the PCB 33 to form a light-emitting package. Accordingly, a plurality of light-emitting units 31 are attached within the PCB 33.

Figure 6D:
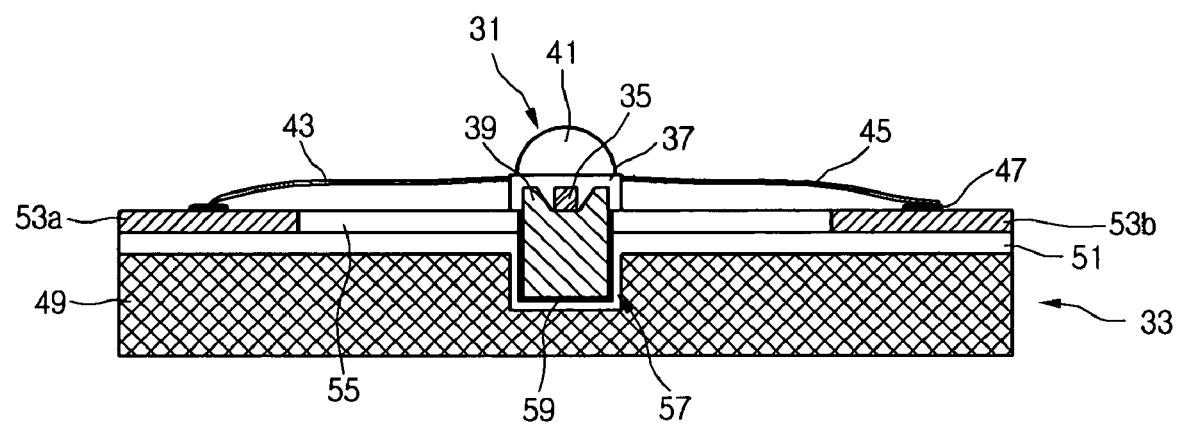

Referring to FIG. 6D, the sides of the heat sink member 39 are positioned within a corresponding recess 57 of the heat sink plate 49. A material having good electrically insulative and thermal conductive properties may be used to attach the heat sink member 39 of the light-emitting unit 31 to the inner surfaces of the insulating layer 51 within the recess 57. In the alternative, the insulating layer 51 can reside only on a top surface of the heat sink plate and an outer surface of the heat sink member 39 of the light-emitting unit 31 can be attached directly to an inner surface of the heat sink plate 49 within the recess 57. Accordingly, a larger heat conduction area can be obtained between the heat sink member 39 and the heat sink plate 49 to improve heat sink capacity. An insulating adhesive 59 having good electrically insulative and thermal conductive properties may be used to fix the heat sink member 39 and the PCB 33 Next, the first and second lead frames 43 and 45 are attached respectively to the first and second metal electrodes 53*a* and 53*b* with a silver paste 47.

Through the above processes, a light-emitting package 30 having high brightness and high heat-sink efficiency can be fabricated. Also, the thickness of the light-emitting package 30 can be minimized and color shift can be prevented. In the above description, the PCB 33 is first prepared and then the light-emitting units 31 are prepared. Alternatively, the light-emitting units 31 may be first prepared before the PCB 33 is prepared. The light-emitting package 30 described above can be applied to various fields including a high-brightness light source for flashlights, a backlight source for portable electronic devices (such as, portable phones, camcorders, digital cameras, and PDAs), a light source for electronic display boards, an illuminator, an illumination light source for switches, a beaconlight, and a traffic signal light.

Figure 7:
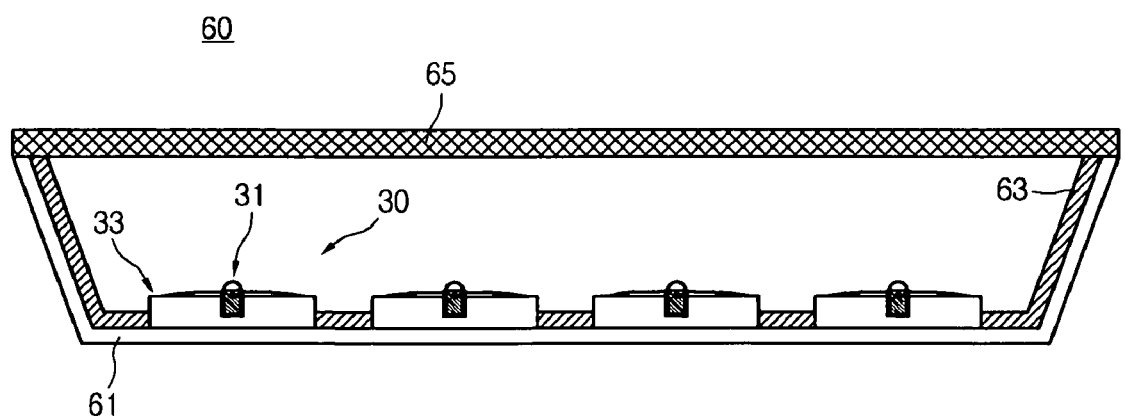
FIG. 7 is a cross-sectional view of a backlight unit having light-emitting packages according to an embodiment of the present invention.

FIG. 7 is a cross-sectional view of a backlight unit having light-emitting packages 30 according to an embodiment of the present invention. Referring to FIG. 7, a backlight unit 60 includes a base frame 61, a plurality of the light-emitting packages 30 disposed on the base frame 61, and a diffusion plate 65 disposed over a plurality of the light-emitting packages 30. The backlight unit 60 may further include a reflection plate 63 formed on the base frame 61. The reflection plate 63 reflects light emitted from a plurality of the light-emitting packages 30.

In each of the a plurality of the light-emitting packages 30, a plurality of recesses 57 are formed in a heat sink plate 49, a plurality of light-emitting units 31 are provided corresponding to each of the recesses 57, and surface of heat sink members 39 for each of the plurality of light-emitting units 31 are positioned within the corresponding recesses 57 for the light-emitting units. The light-emitting packages 30 are attached to the base frame 61. That is, PCBs 33 of the light-emitting packages 30 may be attached to the base frame 61 by bolt/screw connection. In the alternative, the PCBs 33 can be attached to the base frame 61 with an adhesive.

The reflection plate 63 reflects light emitted from the light-emitting packages 30. The reflection plate 63 may be formed on the base frame 61, except for a region in which the light-emitting packages 30 are positioned. For this purpose, the reflection plate 63 may have a plurality of holes (not shown) in which the light-emitting packages 30 are installed on the base frame 61.

The light-emitting units 31 are positioned within recesses 57 in a heat sink plate 49, thereby maximizing the heat sink efficiency of the light-emitting packages. Accordingly, stably high brightness can be obtained by readily dissipating the heat generated by the light-emitting units 31. Also, the thickness of the backlight unit can be reduced due to the reduced thickness of the light-emitting packages.

As described above, the present invention can increase the heat conduction area between the heat sink member of a light-emitting unit and the heat sink plate of a light-emitting package to improve heat dissipation. Also, the rapid heat dissipation property of the light-emitting package in accordance with embodiments of the present invention makes it possible to obtain a desired-color light and high brightness efficiency. Further, because the heat sink member of the light-emitting unit is attached within the heat sink plate of the PCB, the thickness of the light-emitting package in embodiments of the present invention is reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A light-emitting package comprising:
    a plurality of light-emitting units in which each unit includes:
        a housing;
        a heat sink member within the housing and having surfaces outside of the housing; and
        a light emitting diode attached to the heat sink member; and
    a heat sink plate for dissipating heat;
    recesses in the heat sink plate respectively corresponding to the plurality of light-emitting units;
    a first insulating layer within the recesses and on a top surface of the heat sink plate; and
    electrodes on the first insulating layer for supplying electric power to the light emitting diode of each of the plurality of light-emitting units; and
    a second insulating layer on the first insulating layer between the electrodes, the second insulating layer having openings corresponding to the recesses,
    wherein the heat sink member of each of the plurality of light-emitting units is within a corresponding recess of the heat sink plate.

2. The light-emitting package according to claim 1, wherein the light-emitting unit includes a molding member covering the light-emitting diode.

3. The light-emitting package according to claim 2, wherein a first thickness of the housing between the molding member and the heat sink member is smaller than a second thickness of the heat sink member between the light emitting diode and a bottom surface of the heat sink member.

4. The light-emitting package according to claim 1, wherein the heat sink member has outer surfaces for transferring heat to inner surfaces of the corresponding recess.

5. The light-emitting package according to claim 4, wherein a bottom surface and a lower side surface of the heat sink member are within the recess.

6. The light-emitting package according to claim 1, wherein the heat sink member is attached within the corresponding recess of the heat sink plate by an adhesive having electrically insulative and thermally conductive properties.

7. The light-emitting package according to claim 1, wherein the PCB includes an insulating layer formed on the heat sink plate to prevent an electrical short between the heat sink plate and the electrode.

8. The light-emitting package according to claim 1, wherein the PCB is a metal core printed circuit board.

9. The light-emitting package according to claim 1, wherein a lead of each of the light-emitting units is commonly connected to the electrode.

10. A method for fabricating a light-emitting package, comprising:
    forming a plurality of light-emitting units that each include a housing, a heat sink member within the housing and having surfaces outside of the housing, and a light-emitting diode attached to the heat sink member;
    forming a heat sink plate having a plurality of recesses such that the plurality of recesses in the heat sink plate respectively correspond to the plurality of light-emitting units;
    forming a first insulating layer within the recesses and on a top surface of the heat sink plate;

forming electrodes on the first insulating layer for supplying electric power to the light emitting diode of each of the plurality of light-emitting units;

forming a second insulating layer on the first insulating layer between the electrodes, the second insulating layer having openings corresponding to the recesses; and positioning each of the heat sink members for the light-emitting units within the corresponding recess in the heat sink plate for the light-emitting unit.

11. The method according to claim 10, further comprising attaching at least one of the outer surfaces of the heat sink member to an inner surface of the recess.

12. The method according to claim 11, further comprising forming an insulating layer within the recess.

13. The method according to claim 10, comprising attaching the heat sink member within the recess with an adhesive having electrically insulative and thermally conductive properties.

14. The method according to claim 10, further comprising commonly connecting a lead of each light-emitting unit to the electrode.

15. The method according to claim 10, further comprising wirebonding a lead of the light-emitting unit to the light emitting diode.

16. A backlight unit comprising:
a frame;
a plurality of light-emitting packages disposed on the frame, each of the light-emitting packages including:
a printed circuit board including a heat sink plate in which the heat sink plate has a plurality of recesses formed therein, a first insulating layer within the recesses and on a top surface of the heat sink plate, electrodes on the first insulating layer, and a second insulating layer on the first insulating layer between the electrodes, the second insulating layer having openings corresponding to the recesses;
a plurality of light-emitting units that each has a heat sink member attached inside a corresponding recess of the plurality of recesses in the heat sink plate, the heat sink member being outside of the light-emitting units; and
a diffusion plate disposed over the light-emitting package to diffuse light emitted from the light-emitting packages.

17. The backlight unit according to claim 16, further comprising a reflection plate attached to the frame to reflect light emitted from the light-emitting packages.

18. The backlight unit according to claim 16, wherein the heat sink member has surfaces that transfer heat to inner surfaces of the recess.

19. The light-emitting package according to claim 16, wherein each heat sink member has a bottom surface and a lower side surface within the corresponding recess.

* * * * *